United States Patent [19]

Nakajima

[11] Patent Number: 5,473,177

[45] Date of Patent: Dec. 5, 1995

[54] FIELD EFFECT TRANSISTOR HAVING A SPACER LAYER WITH DIFFERENT MATERIAL AND DIFFERENT HIGH FREQUENCY CHARACTERISTICS THAN AN ELECTRODE SUPPLY LAYER THEREON

[75] Inventor: Shigeru Nakajima, Yokohama, Japan

[73] Assignee: Sumitomo Electric Industries, Ltd., Japan

[21] Appl. No.: 180,479

[22] Filed: Jan. 12, 1994

Related U.S. Application Data

[63] Continuation of Ser. No. 793,020, Nov. 15, 1991.

[30] Foreign Application Priority Data

Nov. 16, 1990 [JP] Japan ................................ 2-311061

[51] Int. Cl.[6] ................. H01L 29/161; H01L 29/205; H01L 29/225
[52] U.S. Cl. ............................ 257/194; 257/195; 257/201
[58] Field of Search ................. 357/22 R, 23.2; 257/194, 195, 201

[56] References Cited

U.S. PATENT DOCUMENTS

| 5,105,241 | 4/1992 | Ando ........................................ 357/22 |
| 5,107,319 | 4/1992 | Lauterbach et al. .................... 357/30 |

FOREIGN PATENT DOCUMENTS

| 316139 | 1/1990 | European Pat. Off. . | |
| 2130933 | 11/1988 | Japan . | |
| 0283038 | 11/1990 | Japan | 357/22 |
| 0055851 | 3/1991 | Japan | 357/22 |
| 0104126 | 5/1991 | Japan | 357/22 |

OTHER PUBLICATIONS

Temkin et al., "Insulating Gate InGaAs/InP FET", Applied Physics Letters, vol. 53, No. 25, Dec. 19, 1988, New York, U.S.

Pao et al., "Impact of Surface Layer on InAlAs/InGaAs/InP High Electron Mobility Transistors," IEEE Electron Device Letters, vol. 11, No. 7, Jul. 1990, New York, U.S.A.

Patent Abstracts of Japan, vol. 13, No. 468 (E-834)(3816) 23 Oct. 1989 & JP-A-1 183 859 (Sumitomo) 21 Jul. 1989.

*Primary Examiner*—Rolf Hille
*Assistant Examiner*—Valencia M. Wallace
*Attorney, Agent, or Firm*—Beveridge, DeGrandi, Weilacher & Young

[57] ABSTRACT

There is disclosed a field effect transistor having a channel layer, an electron supply layer, and a spacer layer formed between the channel layer and the electron supply layer. The spacer layer has a thickness for spatially separating a two-dimensional electron gas from donor ions in the electron supply layer, and for forming the two-dimensional electron gas in the channel layer by the Coulomb force of the donor ions. The spacer layer material has better high frequency characteristics than that of the electron supply layer.

6 Claims, 4 Drawing Sheets

5,473,177

FIELD EFFECT TRANSISTOR HAVING A SPACER LAYER WITH DIFFERENT MATERIAL AND DIFFERENT HIGH FREQUENCY CHARACTERISTICS THAN AN ELECTRODE SUPPLY LAYER THEREON

This application is a continuation of application Ser. No. 07/793,020, filed Nov. 15, 1991, which application is entirely incorporated herein by reference.

BACKGROUND OF THE INVENTION

1. Field of the Invention

The present invention relates to a high speed field effect transistor (FET) primarily used in a microwave band.

2. Related Background Art

An excellent high frequency characteristic is required for a semiconductor material of a FET used in a microwave band. Such a material includes an InGaAs semiconductor which exhibits a good electron transport characteristic. Among others, a high electron mobility transistor (HEMT, MODFET) which uses $In_{0.52}Al_{0.48}As$ and $In_{0.53}Ga_{0.47}As$ which match to InP in terms of lattice as an electron supply layer and a channel layer exhibits an excellent high frequency characteristic. Detail of the HEMT is described in IEEE Electron Device Letters, Vol. 11, No. 1, January 1990, pages 56 to 62. An AlGaAs/GaAs-HEMT which uses AlGaAs and GaAs semiconductor materials as the electron supply layer and the channel layer has been put into practice.

The semiconductor material for the electron supply layer is selected to have a larger energy gap and a smaller electron affinity than that of the semiconductor material for the channel layer. When the channel layer is made of GaAs, AlGaAs is selected as the material for the electron supply layer, and when the channel layer is made of InGaAs, AlInAs is selected as the material for the electron supply layer. Two-dimension electron gas is generated in the channel layer by forming the epitaxial structure of the HEMT by those materials.

Usually, a gate length of the FET is very short, for example less than 1 µm. Thus, the electrons which run therealong have a large energy. Accordingly, when a high voltage is applied to a gate electrode, the electrons do not stay in the two-dimension channel but they may jump over an energy barrier which is present on a junction plane of the channel layer and the electron supply layer and are moved to the electron supply layer. This phenomenon is explained as follows with reference to an energy band chart of FIG. 1.

FIG. 1A shows an energy band on a hetero-junction plane of the AlGaAs/GaAs-HEMT; two-dimension electron gas shown by hatching is generated in the GaAs semiconductor near the junction interface. When a high voltage is applied to the gate electrode and a high electric field is applied to the electrons, the electrons $e^-$ in the GaAs semiconductor jump over the energy barrier which is present on the hetero-junction interface and are moved to the AlGaAs semiconductor. The same phenomenon takes place in the AlInAs/InGaAs-HEMT shown in FIG. 1B. When a high electric field is applied to the two-dimension electron gas generated in the InGaAs semiconductor and a high energy is imparted to the electrons $e^-$, the electrons $e^-$ jump over the energy barrier on the hetero-junction interface and are moved to the AlInAs semiconductor.

The AlGaAs or AlInAs semiconductor material which forms the electron supply layer has a smaller electron mobility and a lower electron saturation speed than those of the GaAs or InGaAs semiconductor material which forms the channel layer. As a result, when a portion of electrons moves from the channel layer to the electron supply layer, the electron mobility of the entire current channel decreases and the electron saturation speed reduces. As a result, a high frequency characteristic of the FET is deteriorated. The deterioration of the characteristic is also seen in a transfer conductance $g_m$ which is an index to indicate a transfer function of the device. Namely, in a characteristic of transfer conductance $g_m$ vs gate voltage, the transfer conductance $g_m$ materially decreases as the gate voltage increases in a positive direction.

This problem is pointed out in IEEE Transactions on Electron Devices, Vol. ED-31, No. 1, January 1984 and it is noticed as a technical problem in the high speed FET.

SUMMARY OF THE INVENTION

In the light of the above, it is an object of the present invention to provide a field effect transistor in which a semiconductor layer having a thickness to spatially separate two-dimension electron gas from doner ions of an electron supply layer and form two-dimension electron gas in a channel layer by a Coulomb force of the doner ions and having a better high frequency characteristic than that of the electron supply layer is formed between the channel layer and the electron supply layer.

In accordance with the present invention, when a high electric field is applied to the two-dimension electron gas and the energy of the electrons increases so that the electrons jump out of the channel layer, the electrons are moved to the semiconductor layer of the predetermined thickness having the good high frequency characteristic, which is adjacent to the channel layer. As a result, even if the high electric field is applied to the channel of the FET, the transport characteristic of the electrons is not deteriorated and the high frequency characteristic of the device is assured.

The present invention is particularly effective when it is applied to a basic transistor structure operated in a microwave band or a millimeter wave band and having a gate length of less than 0.25 µm.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE INVENTION

FIG. 1A–1B shows an energy band chart for explaining a problem encountered in a prior art HEMT, FIG. 2 shows a sectional view of a structure according to one embodiment of a HEMT of the present invention, FIG. 3A, 3B and, 3C, 3D shows sectional view in respective steps in manufacturing the HEMT shown in FIG. 2, FIG. 4 shows an energy band of the HEMT shown in FIG. 2, and FIG. 5 shows a graph of a gate voltage $V_g$ vs transfer conductance $g_m$ of the HEMT shown in FIG. 2.

DETAILED DESCRIPTION OF THE PREFERRED EMBODIMENT

Figure 1A:
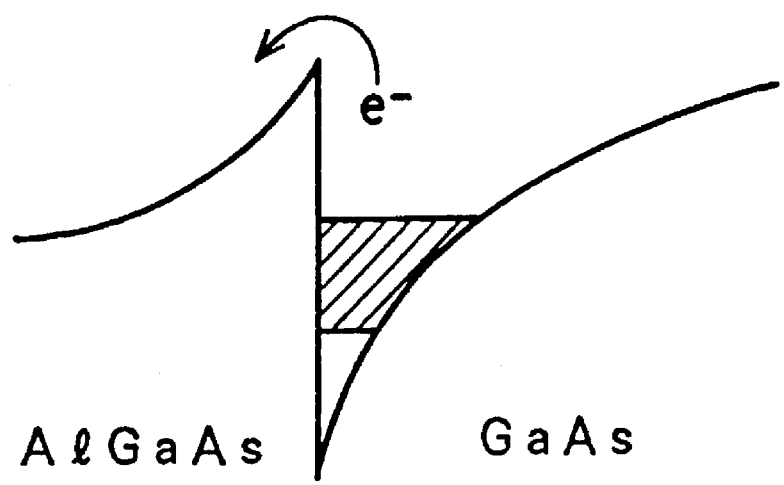
Figure 1B:
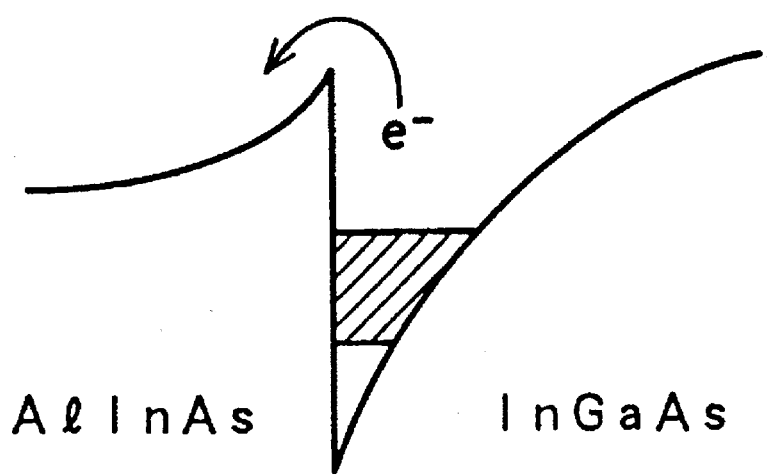
Figure 2:
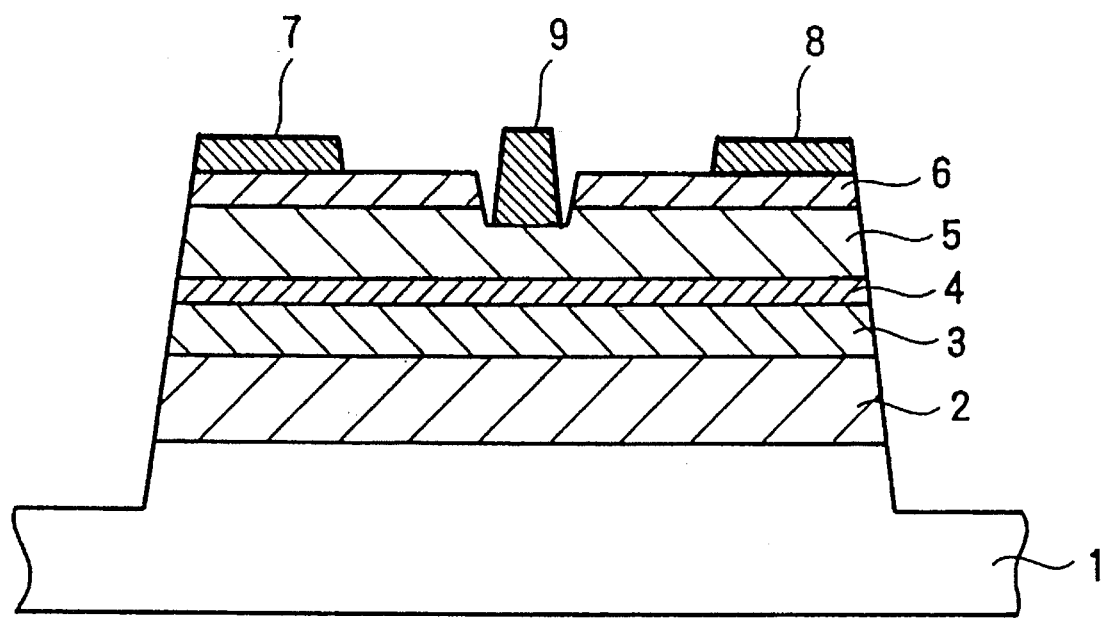

FIG. 2 shows a sectional view of a structure of one embodiment of the HEMT of the present invention. A method for manufacturing the HEMT is explained below with reference to a manufacturing step sectional view shown in FIG. 3.

Figure 3A:
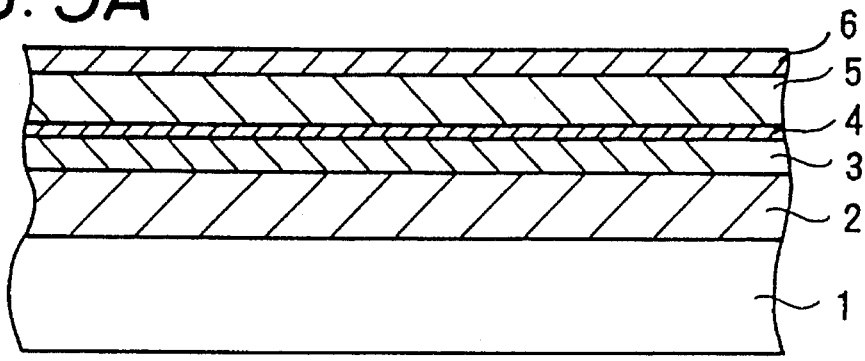

A buffer layer 2, a channel layer 3, a spacer layer 4, an electron supply layer 5 and a contact layer 6 are sequentially and continuously epitaxially grown on an InP semiconductor substrate 1 (see FIG. 3A). The epitaxial growth may be carried out by a molecule beam epitaxy (MBE) method or an organic metal vapor phase epitaxy (OMVPE) method. The buffer layer 2 is made of undoped AlInAs and has a thickness of 1 μm, the channel layer 3 is made of undoped InGaAs and has a thickness of 150 Å, and the spacer layer 4 is made of undoped InP and has a thickness of 30 Å. The electron supply layer 5 is made of n-type AlInAs and has a thickness of 400 Å, and the contact layer 6 is made of n-type InGaAs and has a thickness of 100 Å. The electron supply layer 5 has a doner impurity concentration of $2 \times 10^{18}/cm^3$, and the contact layer 6 has a doner impurity concentration of $5 \times 10^{18}/cm^3$.

The AlInAs material which forms the buffer layer and the electron supply layer 5, and the InGaAs material which forms the channel layer 3 and the contact layer 6 have compositions of $Al_{0.48}In_{0.52}As$ and $In_{0.53}Ga_{0.47}As$, respectively, so that the respective layers match to the InP semiconductor substrate 1 in terms of lattice.

The thickness of the spacer layer 4, 30 Å, is thick enough for the electrons supplied from the electron supply layer 5 to stay in the channel layer 3. Namely, it is thick enough for the Coulomb force of the doner ions in the electron supply layer 5 to be applied to the two-dimension electron gas in the channel layer 3. Further, the spacer layer 4 is thick enough to secure a sufficient spatial distance between doner ions of the electron supply layer 5 and the two-dimension electron gas in the channel layer 3. The InP material which forms the spacer layer 4 has a higher electron saturation speed and a better high frequency characteristic than those of the AlInAs material which forms the electron supply layer 5. It has a lower electron mobility and a higher electron saturation speed than those of the InGaAs material which forms the channel layer 3.

Figure 3B:
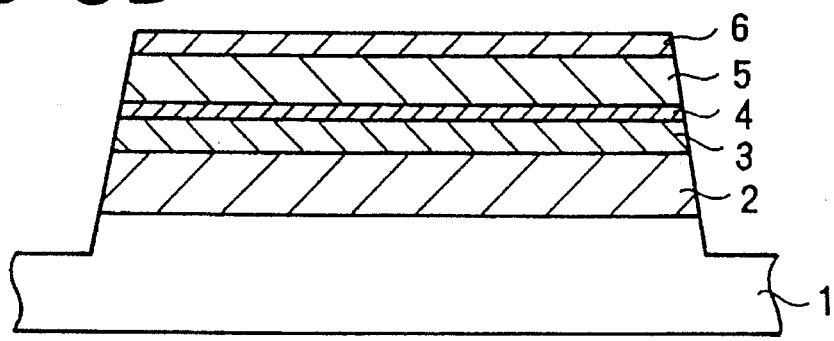
Figure 3C:
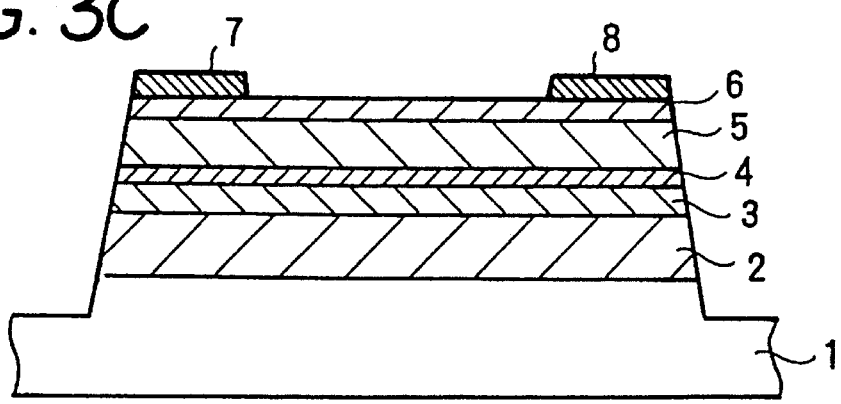

The semiconductor layers in a transistor formation area are selectively etched away by mesa-etching and devices are electrically isolated (see FIG. 3B). Source and drain electrode patterns are patterned on the contact layer 8 by a conventional photolithography method. Afterward, an AuGe/Ni metal is vapor-deposited and the patterns are lifted off. The electrode metals left after the lift-off are alloyed at 400° C. for one minute to make ohmic contacts to the contact layer 6 to form a source electrode 7 and a drain electrode 8 (see FIG. 3C).

Figure 3D:
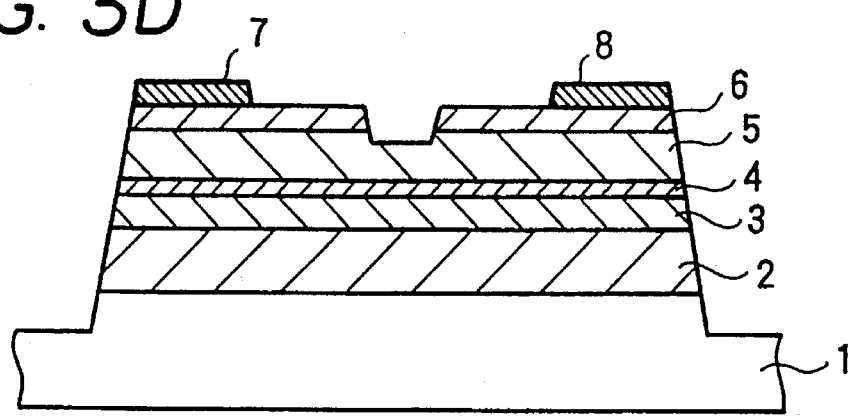

Then a gate electrode is patterned by an electron beam lithography method, and a recess is formed in the gate electrode formation area by using the pattern as a mask (see FIG. 3D). The depth of the recess is controlled such that a predetermined drain current is produced, and a Ti/Pt/Au metal is vapor-deposited. After the vapor-deposition, the electrode pattern is lifted off to form a gate electrode 9. In this manner, the HEMT having the structure shown in FIG. 2 is formed. In FIG. 2, the like elements to those shown in FIG. 3 are designated by the like numerals.

Figure 4:
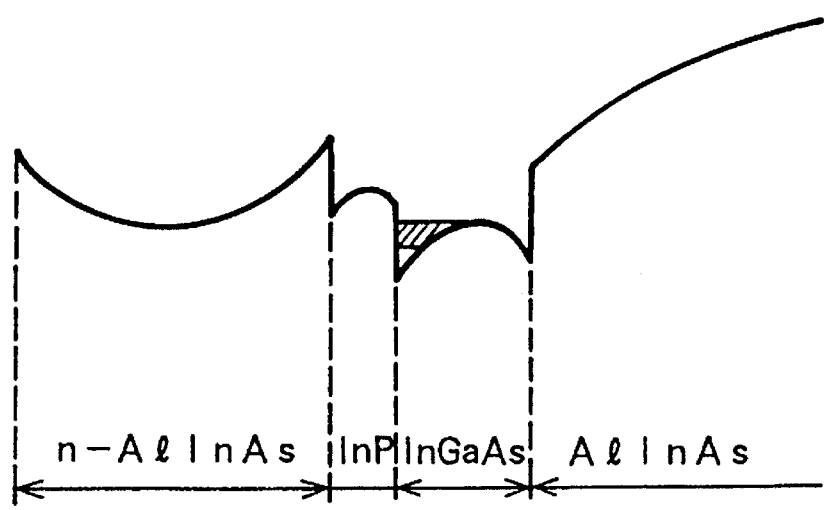

The energy band of the HEMT having such an epitaxial structure is shown in FIG. 4. The areas of FIG. 4 correspond to the electron supply layer (n-AlInAs) 5, the spacer layer (InP) 4, the channel layer (undoped InGaAs) 3 and the buffer layer (undoped AlInAs) 2, from left to right. An energy gap is formed in the channel layer 3 near the junction of the spacer layer 4 and the channel layer 3, and the two-dimension electron gas shown by hatching is generated in the energy gap. An energy band which supports the accumulation of the two-dimension electron gas is present in the spacer layer 4 and a higher energy barrier than the energy band is formed between the electron supply layer 5 and the spacer layer 4.

When a high voltage is applied to the gate electrode 9 and a high electric field is applied to the two-dimension electron gas, the electrons in the channel bear a high energy. As a result, some of the electrons in the two-dimension electron gas jump out of the energy gap formed in the channel layer 3. The electrons which "jumped-out" are attracted to the electron supply layer 5 by the Coulomb force of the doner ions in the electron supply layer 5 but they are caused to stay in the spacer layer 4 by the energy barrier between the electron supply layer 5 and the spacer layer 4.

As described above, the InP material which forms the spacer layer 4 has a better high frequency characteristic and a higher electron saturation speed than that of the AlInAs material which forms the electron supply layer 5. Also, the InP material has a lower electron mobility and a higher electron saturation speed than that of the InGaAs material which forms the channel layer 3. As a result, even if the electrons jump out of the channel layer 3 when the high electric field is applied to the two-dimension electron gas, the electrons which jumped-out travel in the spacer layer 4 having the high electron saturation speed. Accordingly, the high frequency characteristic of the device does not deteriorate unlike the prior art device, even if a high electric field is applied to the two-dimension electron gas.

Figure 5:
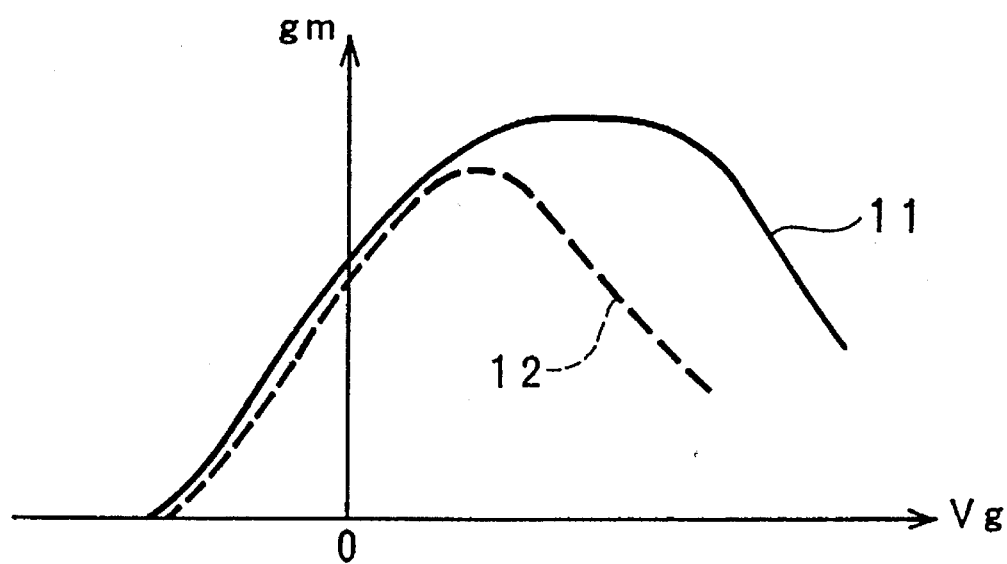

A gate voltage vs transfer conductance $g_m$ characteristic of the HEMT is shown in FIG. 5, in which an abscissa represents the gate voltage $V_g$, an ordinate represents the transfer conductance $g_m$, a solid line curve 11 shows a characteristic of the HEMT of the present embodiment, and a broken line curve 12 shows a characteristic of a prior art HEMT. As seen from FIG. 5, in the characteristic curve 11 for the present embodiment, the decrease of the transfer conductance $g_m$ is suppressed when the gate voltage $V_g$ increases in the positive direction. On the other hand, in the characteristic curve 12 for the prior art, the decrease of the transfer conductance $g_m$ is remarkable as the gate voltage $V_g$ increases. In accordance with the HEMT of the present embodiment, a high transfer conductance $g_m$ is assured over a wide range of gate voltage.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:

an electron supply layer formed by a first material, said first material of said electron supply layer being doped to have donors therein, a channel layer in which a two-dimensional electron gas is generated by Coulomb force corresponding to said donors in said electron supply layer, and a spacer layer formed between said channel layer and said electron supply layer, said spacer layer being formed of a second material for spatially separating said two-dimensional electron gas from said donors in said electron supply layer, said electron supply layer and said spacer layer being formed of different elements, said second material having a better high frequency characteristic and having a higher electron saturation speed than that of said first material, and said second material having a lower electron mobility than that of said channel layer and a higher electron saturation than that of the material of said channel layer.

2. A field effect transistor according to claim 1 wherein said channel layer is formed of undoped InGaAs, said spacer layer is formed of undoped InP and said electron supply layer is formed of n-type AlInAs.

3. A field effect transistor according to claim 2 wherein said transistor also comprises:

an InP semiconductor substrate; and a buffer layer formed on said semiconductor substrate and formed of undoped AlInAs; and wherein said channel layer is formed on said buffer layer and is formed of undoped InGaAs;

said spacer layer is formed on said channel layer and is formed of undoped InP; and said electron supply layer is formed on said semiconductor layer and is formed of n-type AlInAs; and further wherein a contact layer is formed on said electron supply layer and is formed of n-type InGaAs;

at least two ohmic electrodes are formed on said contact layer; and a gate electrode is formed in a recess formed in said contact layer and said electron supply layer.

4. A field effect transistor according to claim 3 wherein said buffer layer and said electron supply layer are formed of $Al_{0.48}In_{0.52}As$, and said channel layer and said contact layer are formed of $In_{0.53}Ga_{0.47}As$.

5. A field effect transistor according to claim 1, wherein said spacer layer has a thickness of substantially 30 angstrom units.

6. A field effect transistor according to claim 5, wherein said spacer layer is formed on said channel layer and is formed of undoped InP whereby said InP material thereof has a higher electron saturation speed than that of said first material of said electron supply layer, and a lower electron mobility and a higher electron saturation speed than that of a material which forms said channel layer.

* * * * *